(12) United States Patent
Savory et al.

(10) Patent No.: US 8,755,195 B2
(45) Date of Patent: Jun. 17, 2014

(54) ESD DISCHARGE PATH ON CHASIS-MOUNTED PCB ASSEMBLY

(75) Inventors: David Alan Savory, Schnecksville, PA (US); Joshua A. Johnson, Rochester, MN (US)

(73) Assignee: LSI Corporation, Milpitas, CA (US)

( * ) Notice: Subject to any disclaimer, the term of this patent is extended or adjusted under 35 U.S.C. 154(b) by 183 days.

(21) Appl. No.: 13/492,152

(22) Filed: Jun. 8, 2012

(65) Prior Publication Data
US 2013/0329353 A1 Dec. 12, 2013

(51) Int. Cl.
*H05K 5/00* (2006.01)
*H05K 7/18* (2006.01)
*H05K 1/00* (2006.01)
*H05K 1/18* (2006.01)
*H05K 7/00* (2006.01)
*H05K 1/03* (2006.01)

(52) U.S. Cl.
USPC ............ 361/753; 361/799; 361/748; 174/255

(58) Field of Classification Search
USPC ................ 361/748, 752, 753, 757, 796, 799; 174/255, 256, 258
See application file for complete search history.

(56) References Cited

U.S. PATENT DOCUMENTS

| 7,589,283 B2* | 9/2009 | Danoski et al. ............... 174/260 |
| 2002/0044098 A1* | 4/2002 | Von Stein et al. ............. 343/770 |
| 2007/0165376 A1* | 7/2007 | Bones et al. .................. 361/688 |

* cited by examiner

*Primary Examiner* — Hoa C Nguyen
*Assistant Examiner* — Binh Tran

(57) ABSTRACT

In described embodiments, a printed circuit board assembly capable of discharging electro-static discharge (ESD) surges includes an isolation trench track provided in the printed circuit board in close proximity to the peripheral edges between the peripheral edges and the mounting area, and a discharge path formed of conductive material to ground provided between the isolation trench track and the peripheral edges. The discharge path includes the board mounting screws and connects to a power connector ground of the printed circuit board.

19 Claims, 3 Drawing Sheets

ESD DISCHARGE PATH ON CHASIS-MOUNTED PCB ASSEMBLY

BACKGROUND OF THE INVENTION

Electro-static discharge (ESD) is a major reliability issue in printed circuit boards and/or integrated circuits (ICs). ESD is a transient surge in voltage (negative or positive) that may induce a large current in. The large circuit current in a circuit damages the elements, conductive paths, and other parts of the IC's circuits and causes a failure during testing on some disk drives. To protect circuits against damage from ESD surges, various protection schemes attempt to provide a discharge path for both positive and negative ESD surges.

An example of an ESD surge problem is meeting system-level ESD testing requirements on some disk drives using a hard disk drive (HDD) controller. Many experiments have been performed to understand the underlying root cause mechanism of the ESD discharge disrupting the operation of the disk drive controller. Interaction between the disk drive controller and a double data rate synchronous dynamic random-access memory (DDR SDRAM) may be corrupted by the ESD surge. If isolating the PCB assembly from the case and providing capacitive or resistive coupling to spread the discharge current flowing through the PCB assembly over time, a decrease in sensitivity to the ESD event may be provided, however, the sensitivity may not be decreased enough to meet the goals, and at high enough ESD voltages arcing from the mounting screws to nearby PCB assembly ground points may be observed.

SUMMARY OF THE INVENTION

This summery is provided to introduce a selection of concepts in a simplified form that are further described below in the detailed description with reference to the drawings. This summary is not intended to identify key features or essential features of the claimed subject matter, nor is it intended to limit the scope of the claimed subject matter.

Embodiments of the present allow for discharging ESD for a printed circuit board having board mounting points formed in the printed circuit board close to peripheral edges of the printed circuit board, and a mounting area formed on a top of the printed circuit board around a central section of the printed circuit board on which a plurality of integrated circuit modules are mounted. Board mounting screws inserted in the respective board mounting points secure the printed circuit board on the top of a chassis with the board mounting screws tightened on the chassis. An isolation trench track is formed in the printed circuit board in close proximity to the peripheral edges between the peripheral edges and the mounting area, and a discharge path to ground is provided between the isolation trench track and the peripheral edges, the discharge path including the board mounting screws and connecting to a power connector ground of the printed circuit board. An ESD discharge current flows along the discharge path to reach to aground reference point, such that the ESD discharge current circumvents the integrated circuit modules isolated from the discharge path to ground.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Hereinafter, embodiments of the present invention are described with reference to the drawings. In described embodiments, an ESD discharge path is provided on a chassis-mounted printed circuit board (PCB) assembly. The PCB assembly might be constructed with a separate path from chassis mounting points to a power connector ground such that charge created by, for example, and ESD discharge desirably flows through a path avoiding an area of the PCB assembly having operating circuitry. More specifically, embodiments of the present invention might provide a direct discharge path for discharging ESD current from board mounting screws to the power connector ground of the PCB assembly. Thus, a PCB assembly ground plane remains in direct contact with board mounting screws (and, thus, the case of the PCB assembly) and the power connector ground such that an ESD discharge current flows along the discharge path to reach to aground reference point, circumventing the integrated circuit modules that are isolated front the discharge path to ground as a result.

Figure 1:
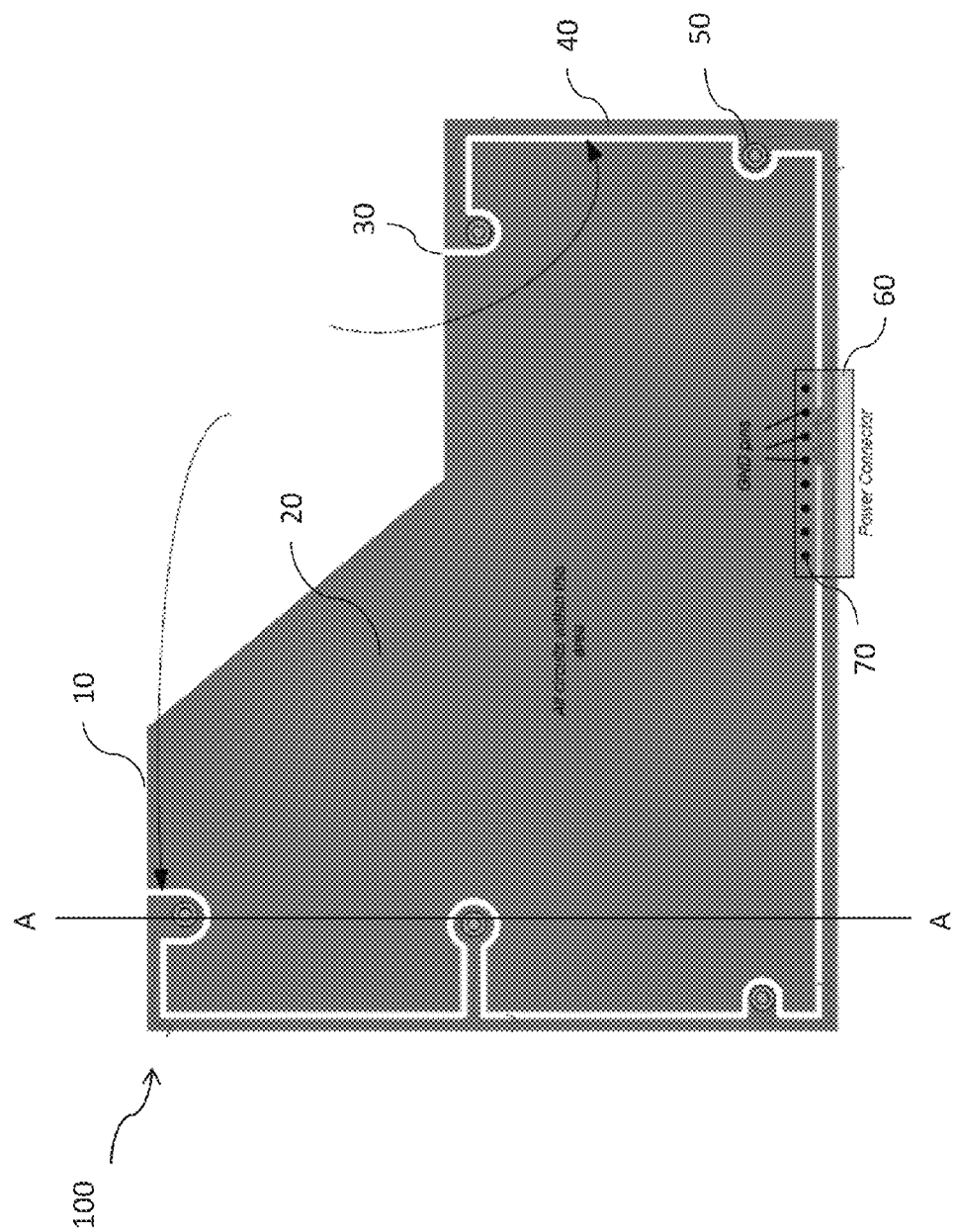
FIG. 1 is a top view of a printed circuit board (PCB) assembly in accordance with an exemplary embodiment of the present invention.

Embodiments of the present invention might provide the advantages of increased reliability, protection of integrated circuit modules of an IC from ESD, and isolation front effects of noise to the circuitry of the IC. In contrast, for example, a Hard-Disk Drive (HDD) typically supports a power connector ground as the only connection to ground. The power connector ground may connect to the PCB assembly ground, which may also be connected to the chassis (or Disk Drive enclosure in the example) at the PCB assembly mounting points. If an ESD surge charges the chassis, then the charge may enter the PCB assembly at the mounting points and flow through the PCB assembly ground plane to the power connector, possibly disrupting circuit operation of the disk controller. Thus, a direct connection from the PCB assembly mounting points to the power connector is applied in accordance with embodiments of the present invention. With this direct connection a separate discharge path on the PCB assembly may route the ESD discharge current around the operating circuit to avoid disrupting it. This configuration on the existing HDD case and PCB assembly may provide a separate discharge path that may divert ESD discharge current around the operating disk drive controller to avoid disrupting the controller FIG. 1 is a top view of a printed circuit hoard (PCB) assembly having an ESD discharge path in accordance with an exemplary embodiment of the present invention. PCB assembly 100 includes printed circuit board 10 having a plurality of integrated circuit (IC) modules and/or electrical components (not shown) variously mounted on, or otherwise incorporated into, printed circuit board 10. Printed circuit board 10 includes mounting area 20, isolation trench track 30, discharge path 40, board mounting screws 50, power connector 60 and ground pins 70. Integrated circuit modules and/or electrical components are typically mounted on circuit mount area 20, and might be plugged into sockets formed in circuit mount area 20 on printed circuit board 10.

Printed circuit board 10 typically includes patterned conductive traces formed from copper or other conductive materials as known in the art. These conductive traces might be employed for data signals and power leads/rails for IC circuit modules or electrical components that are mounted to printed circuit board 10. Printed circuit board 10 may be used to mount various IC modules or electronic components, such as a microprocessor, a memory chip, audio chips, communications circuits, application-specific integrated circuits, digital signal processing circuits, power management circuits, and the like. Discrete components such as resistors, inductors, and capacitors may also be mounted on printed circuit hoard 10. Microphones, speakers, light-emitting diodes, and sensors such as light and pressure sensors are additional examples of components that may be mounted on printed circuit board 10. To facilitate connections with other boards in the device and peripheral components, connectors may be mounted on printed circuit board 10. Non-electrical features such as plastic posts might be mounted to printed circuit board among the electrical components.

Mounting area 20 is located on the top of printed circuit board 10 on which the plurality of electronic component or IC modules might be mounted. Mounting area 20 is a central section of printed circuit board 10 and excludes the periphery area of printed circuit board 10.

Figure 2:
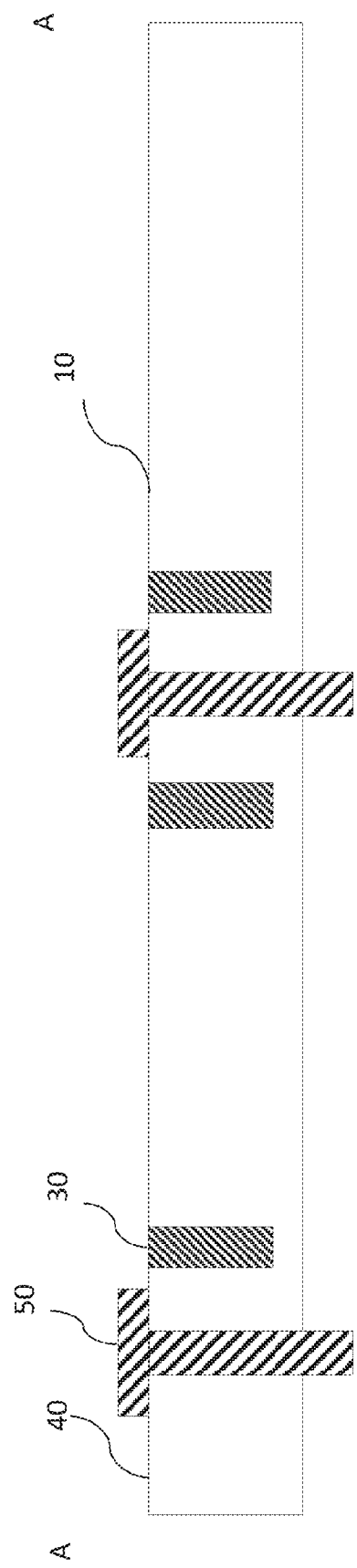
FIG. 2 is an exemplary first cross-sectional side view of the PCB of FIG. 1.

Isolation trench track 30 may be formed in printed circuit board 10 in close proximity to the peripheral edges of printed circuit board 10 between peripheral edges of printed circuit hoard 10 and mounting area 20. FIG. 2 is a cross-sectional side view taken along line AA in FIG. 1. As shown, isolation trench track 30 partially penetrates through printed circuit board 10. Isolation trench track 30 may be formed by etching the surface of printed circuit board 10, although the present invention is not limited thereto and one skilled in the art might employ other methods, such as by laser cutting or mechanical cutting. After forming a trench track near the periphery edges of printed circuit board 10, the trench track may be filled with a non-conductive material or a dielectric material, such as epoxy resin prepreg, when forming isolation trench track 30. Some of these dielectrics that might be selected are polytetrafluoroethylene (Teflon), FR-4, FR-1, CEM-1 or CEM-3. Well known prepreg materials used in the PCB industry are FR-2 (Phenolic cotton paper), FR-3 (Cotton paper and epoxy), FR-4 (Woven glass and epoxy), FR-5 (Woven glass and epoxy), FR-6 (Matte glass and polyester), G-10 (Woven glass and epoxy), CEM-1 (Cotton paper and epoxy), CEM-2 (Cotton paper and epoxy), CEM-3 (Non-woven glass and epoxy), GEM-4 (Woven glass and epoxy), GEM-5 (Woven glass and polyester). Thus, no conductive material, such as copper, is contained in isolation trench track 30.

To assure ESD discharge current circumvents the operational circuitry on printed circuit board 10, isolation trench track 30 is positioned at a spaced location from the edge of printed circuit board 10 on which the operational circuitry being protected is mounted, providing an alternate path (discharge path 40, as discussed subsequently below) to ground between isolation trench track 30 and the board periphery. Furthermore, isolation trench track 30 may terminate at one or more locations in printed circuit board 10. For example, isolation trench track 30 may terminate at aground reference point, for example, the power connector ground, of printed circuit board 10. Because of the formation of isolation trench track 30 in printed circuit board 10, discharge path 40 is provided in printed circuit board 10 to ground between isolation trench track 30 and the board peripheral edges of printed circuit board 10 for discharging the ESD current.

As described, discharge path 40 is formed between isolation trench track 30 and the periphery edges of printed circuit board 10, and is separated from mounting area 20 by isolation trench track 30. Discharge path 40 may connect to a ground plane of printed circuit board 10 at one or more points, for example, to power connector 60 of printed circuit board 10. Discharge path 40 may tie to ground layers of printed circuit board 10 at power connector ground pins 70 (FIG. 1). Discharge path 40 may be a conductive material made of, for example, copper, though any conductor known in the art might be employed, such as platinum, gold, etc. Thus, there may be a conductive "bridge" fabricated of the conductive material from the outer perimeter of printed circuit board 10, which is the isolated portion of the board to power connector ground pins 70. At power connector ground pins 70, discharge path 40 ties to, for example, the main PCB assembly ground layers of a given implementation. In this manner, ESD discharge current flows around the perimeter of printed circuit board 10 in discharge path 40 to reach the power connector ground pins to ground, thereby circumventing operational circuitry, and so does not disrupt the operational circuitry that is isolated from discharge path 40 to ground.

A plurality of board mounting screws 50 may be employed in printed circuit board assembly 100. Printed circuit board 10 may have holes formed in the printed circuit board close to the peripheral edges of printed circuit board 10. The holes may be board mounting points through which board mounting screws 50 pass. Thus, Printed circuit board assembly 100 may be secured on the top of a chassis of a device housing (not shown) with board mounting screws 50 tightened on the chassis. Board mounting screws 50 may be evenly distributed in the periphery area of printed circuit board 10. Board mounting screws 50 may be made of metal, plastic or other material that applies to mounting screws. In addition, board mounting screws 50 are separated from mounting area 20 by isolation trench track 30 and located within discharge path 40. As such, when ESD discharge current enters PCB assembly via board mounting screws 50, because of the formation of discharge path 40, discharge current may flow around the perimeter of printed circuit board 10 to reach ground (GND) pins 70 of power connector 60. Thus, little or no voltage gradient is created in mounting area 20 of the board ground plane, and circuit operation in mounting area 20 of printed circuit board 10 undisturbed.

Figure 3:
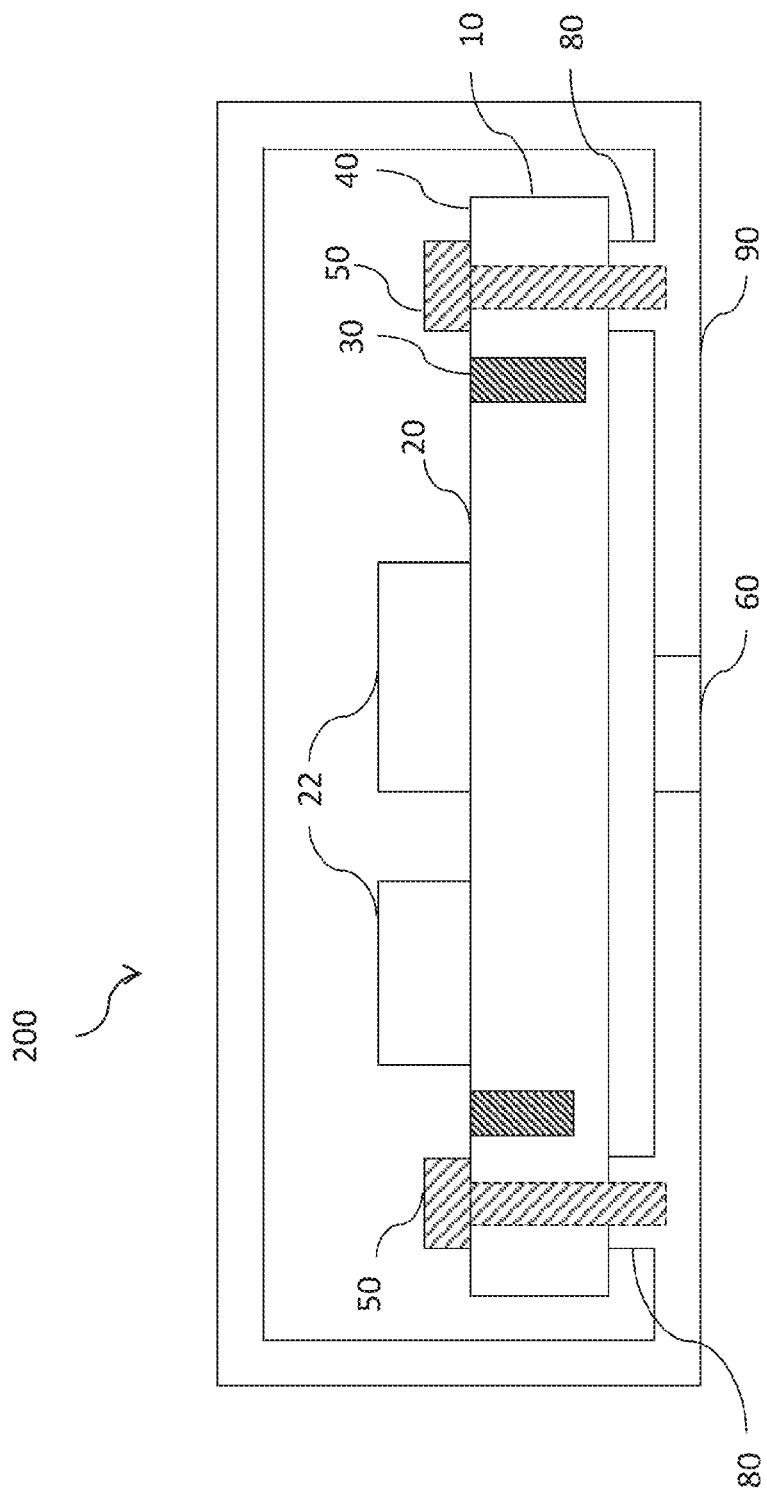
FIG. 3 is an exemplary second cross-sectional side view of an illustrative PCB assembly mounted on a housing portion of an electrical device in accordance with an exemplary embodiment of the present invention.

Printed circuit board assembly 100 may be a chassis-mounted printed circuit board assembly mounted on a chassis or a housing portion of an electronic device. The electronic device may include a housing, sometimes referred to as a case, that might be formed from metal, composites, plastic, other suitable materials, or combinations of these materials. An illustrative electronic device that may include an ESD discharge path in a printed circuit board that mounted on a chassis is shown in FIG. 3. As shown, printed circuit hoard assembly 100 may be mounted on chassis 90 on chassis portions such as posts 80 using screws such as hoard mounting screws 50. Printed circuit board 10 may have holes through which board mounting screws 50 pass. Posts 80 may have threaded bores that receive the threaded ends of hoard mounting screws 50. When hoard mounting screws 50 are tightened, printed circuit board assembly 100 may be held against posts 80 and thereby secured on chassis 90 that may be an interior portion of a device housing. As described above, the IC modules or electrical components 22 may be mounted on circuit mounting area 20 on printed circuit boards 10.

Electronic devices often contain one or more printed circuit boards. For the electronic devices contain more than one printed circuit boards, an isolation trench track may be formed in each printed circuit board in close proximity to the peripheral edges of the printed circuit board between the peripheral edges of the printed circuit board and the mounting area of the central section of the printed circuit board, creating an ESD discharge path to ground that does not disrupt the operational circuitry in the central section isolated from the discharge path to ground.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized No claim element herein is to be construed under the provisions of 35 U.S.C. §112, sixth paragraph, unless the element is expressly recites using the phrase "means for" or "step for."

It will be further understood that various changes in the details, materials, and arrangements of the parts which have been described and illustrated in order to explain the nature of this invention may be made by those skilled in the art without departing from the scope of the invention as expressed in the following claims.

We claim:

1. A chassis-mounted printed circuit board assembly capable of discharging electro-static discharge (ESD) comprising: a printed circuit board having board mounting points formed in the printed circuit board close to peripheral edges of the printed circuit board, and a mounting area formed on a top of the printed circuit board around a central section of the printed circuit board on which a plurality of integrated circuit modules are mountable; wherein the mounting area comprises a hard disk controller coupled to a memory; one or more board mounting screws inserted through the printed circuit board mounting points to secure the printed circuit board on the top of a chassis with the board mounting screws tightened on the chassis; an isolation trench track formed in the printed circuit board in close proximity to the peripheral edges between the peripheral edges and the mounting area; and a discharge path to ground provided between the isolation trench track and the peripheral edges, the discharge path formed of conductive material and including the one or more hoard mounting screws and coupled to a power connector ground of the printed circuit board, wherein an ESD discharge current flows along the discharge path to reach to a ground reference point, such that the ESD discharge current circumvents the integrated circuit modules isolated from the discharge path to ground.

2. The chassis-mounted printed circuit board assembly of claim 1, wherein the isolation trench track is an in-board isolation trench track formed in the printed circuit board.

3. The chassis-mounted printed circuit board assembly of claim 2, wherein the isolation trench track is formed by at least one of etching, laser cutting, and mechanical cutting the printed circuit board.

4. The chassis-mounted printed circuit hoard assembly of claim 3, wherein the isolation trench track is filled with a non-conductive material.

5. The chassis-mounted printed circuit board assembly of claim 1, wherein the isolation trench track terminates at the ground reference point of the printed circuit board.

6. The chassis-mounted printed circuit board assembly of claim 1, wherein the discharge path ties to ground layers of the printed circuit board assembly at ground pins of the power connector.

7. The chassis-mounted printed circuit board assembly of claim 6, wherein a power connector ground remains in direct contact with the board mounting screws and a ground plane of the printed circuit board.

8. The chassis-mounted printed circuit board assembly of claim 1, wherein the discharge path conductive material is at least one of copper, platinum and gold.

9. The chassis-mounted printed circuit board assembly of claim 8, wherein the mounting area comprises at least one integrated circuit.

10. The chassis-mounted printed circuit board assembly of claim 1, wherein the board mounting points are formed at corners and along the board peripheral edges of the printed circuit board.

11. A printed circuit board assembly capable of discharging electro-static discharge (ESD) comprising: a printed circuit board having board mounting points formed in the printed circuit board close to peripheral edges of the printed circuit board, and a mounting area formed on a top of the printed circuit board around a central section of the printed circuit board on which a plurality of integrated circuit modules are mountable; wherein the mounting area comprises a hard disk controller coupled to a memory; one or more board mounting screws inserted through the printed circuit board mounting points to secure the printed circuit board on the top of a chassis with the board mounting screws tightened on the chassis; an isolation trench track formed in the printed circuit board in close proximity to the peripheral edges between the peripheral edges and the mounting area; and a discharge path to ground provided between the isolation trench track and the peripheral edges, the discharge path formed of conductive material and including the one or more board mounting screws and coupled to a power connector ground of the printed circuit board, wherein an ESD discharge current flows along the discharge path to reach to a ground reference point, such that the ESD discharge current circumvents the integrated circuit modules isolated from the discharge path to ground.

12. The printed circuit board assembly of claim 11, herein the isolation trench track is an in-hoard isolation trench track formed in the printed circuit board.

13. The printed circuit board assembly of claim 12, wherein the isolation trench track is formed by at least one of etching, laser cutting, and mechanical cutting the printed circuit board.

14. The printed circuit board assembly of claim 13, wherein the isolation trench track is filled with a non-conductive material.

15. The printed circuit board assembly of claim 11, wherein the isolation track terminates at the ground reference point of the printed circuit board.

16. The printed circuit board assembly of claim 11, wherein the discharge path ties to ground layers of the printed circuit board assembly at ground pins of the power connector.

17. The printed circuit board assembly of claim 16, wherein a power connector ground remains in direct contact with the board mounting screws and a ground plane of the printed circuit board.

18. The printed circuit board assembly of claim 11, wherein the conductive material is least one of copper, platinum and gold.

19. The printed circuit board assembly of claim 11, wherein the board mounting points are formed at corners and along the board peripheral edges of the printed circuit board.

\* \* \* \* \*